(12) United States Patent
Zhang et al.

(10) Patent No.: US 11,525,849 B2
(45) Date of Patent: Dec. 13, 2022

(54) METHOD AND DEVICE FOR IMPROVING PHASE MEASUREMENT ACCURACY

(71) Applicant: DATANG MOBILE COMMUNICATIONS EQUIPMENT CO., LTD, Beijing (CN)

(72) Inventors: Yong Zhang, Beijing (CN); Jing Shi, Beijing (CN)

(73) Assignee: DATANG MOBILE COMMUNICATIONS EQUIPMENT CO., LTD, Beijing (CN)

( * ) Notice: Subject to any disclaimer, the term of this patent is extended or adjusted under 35 U.S.C. 154(b) by 20 days.

(21) Appl. No.: 17/281,970

(22) PCT Filed: Oct. 12, 2019

(86) PCT No.: PCT/CN2019/110890
§ 371 (c)(1),
(2) Date: Mar. 31, 2021

(87) PCT Pub. No.: WO2020/078291
PCT Pub. Date: Apr. 23, 2020

(65) Prior Publication Data
US 2021/0341521 A1 Nov. 4, 2021

(30) Foreign Application Priority Data
Oct. 19, 2018 (CN) .......................... 201811224077.1

(51) Int. Cl.
*H04L 1/16* (2006.01)
*H04L 25/02* (2006.01)
(Continued)

(52) U.S. Cl.
CPC ............. *G01R 23/16* (2013.01); *G01R 25/04* (2013.01); *H04L 1/1657* (2013.01); *H04L 1/24* (2013.01); *H04L 25/0202* (2013.01)

(58) Field of Classification Search
CPC ........ G01R 23/16; G01R 25/04; G01R 25/00; H04L 1/1657; H04L 1/24; H04L 25/0202;
(Continued)

(56) References Cited

U.S. PATENT DOCUMENTS 8,737,012 B2 * 5/2014 Otani ................... G11B 5/5582
360/78.04
2007/0053455 A1 3/2007 Sugiyama
(Continued)

FOREIGN PATENT DOCUMENTS

CN 107689842 A 2/2018

*Primary Examiner* — Atique Ahmed
(74) *Attorney, Agent, or Firm* — Bayramoglu Law Offices LLC

(57) ABSTRACT

A method and device for increasing an accuracy of a phase measurement, wherein the method includes: receiving a measurement signal; performing a frequency-domain transformation to the measurement signal to obtain a frequency-domain measurement sequence; determining phases that correspond to frequency-domain measurement signals, and determining a phase difference between the frequency-domain measurement signals that correspond to two neighboring specified frequency points; according to the phases, the phase difference and a window function, performing a sliding-window-type phase fitting to the frequency-domain measurement sequence, to obtain phase-fitting data that correspond to sliding windows; and according to the phase-fitting data of the sliding windows, determining phase-calibration data that correspond to the sliding windows, and, by using the phase-calibration data of the sliding windows, forming phase-calibration data within a specified frequency band. The method reduces an error of fitting, and increases an accuracy of a phase calibration.

11 Claims, 7 Drawing Sheets

(51) Int. Cl.
*G01R 23/16* (2006.01)
*G01R 25/04* (2006.01)
*H04L 1/24* (2006.01)

(58) Field of Classification Search
CPC ........... H04L 2027/0087; H04L 25/022; H04L 27/0014
See application file for complete search history.

(56) References Cited

U.S. PATENT DOCUMENTS

| | | | |
|---|---|---|---|
| 2013/0062508 A1* | 3/2013 | Kanter | H03M 1/1265 |
| | | | 250/214 DC |
| 2013/0329835 A1* | 12/2013 | Keegan | G01S 1/045 |
| | | | 375/350 |
| 2017/0180055 A1* | 6/2017 | Yu | H04J 14/06 |
| 2017/0331670 A1* | 11/2017 | Parkvall | H04W 52/0245 |
| 2019/0007051 A1* | 1/2019 | Sete | G06N 10/00 |
| 2019/0393618 A1* | 12/2019 | Guthrie | H01Q 3/36 |

* cited by examiner

101 — receiving a measurement signal, wherein the measurement signal is generated according to a frequency-domain calibration sequence, the frequency-domain calibration sequence comprises N frequency-domain calibration signals, each of the frequency-domain calibration signals corresponds to one specified frequency point, the specified frequency points are within a specified frequency band, and N is an integer greater than 1

102 — performing frequency-domain transformation to the measurement signal to obtain a frequency-domain measurement sequence, wherein the frequency-domain measurement sequence comprises N frequency-domain measurement signals, and each of the frequency-domain measurement signals corresponds to one specified frequency point 103 — determining phases that correspond to the frequency-domain measurement signals, and determining a phase difference between frequency-domain measurement signals that correspond to two neighboring specified frequency points 104 — according to the phases, the phase difference and a window function, performing sliding-window-type phase fitting to the frequency-domain measurement sequence, to obtain phase-fitting data that correspond to sliding windows 105 — according to the phase-fitting data of the sliding windows, determining phase-calibration data that correspond to the sliding windows, and, by using the phase-calibration data of the sliding windows, forming phase-calibration data within the specified frequency band

FIG. 1

METHOD AND DEVICE FOR IMPROVING PHASE MEASUREMENT ACCURACY

CROSS REFERENCE TO THE RELATED APPLICATIONS

This application is the national stage entry of International Application No. PCT/CN2019/110890, filed on Oct. 12, 2019, which is based upon and claims priority to Chinese Patent Application No. 201811224077.1, filed on Oct. 19, 2018, the entire contents of which are incorporated herein by reference.

TECHNICAL FIELD

The present application relates to the technical field of data processing, and particularly relates to a method for increasing an accuracy of phase measurement and a device for increasing an accuracy of phase measurement.

BACKGROUND

In the process from the emission of a signal from a transmitter to the receiving of the signal at a receiver, as affected by the channel environment, the signal might have loss, fading and so on, which results in phase deviation between the wireless signal received by the receiver and the wireless signal emitted by the transmitter. Therefore, in order to accurately recover at the receiving end the signal sent by the transmitting end, it is required to calibrate the phase of the received signal at the receiving end.

The receiving end usually employs a phase calibration factor to calibrate the phase of the received signal. The conventional method of determining the phase calibration factor is performing linear fitting to the phase of the whole frequency band that corresponds to the communication system, and determining the phase calibration factor of the whole frequency band according to the result of the fitting. Because the phase-frequency response characteristic of the analog devices or the transmission network cannot be completely ideal, or, in other words, the phase is not completely linear within the whole frequency band, the linear fitting to the whole frequency band results in errors, which reduces the accuracy of the phase calibration.

SUMMARY

The embodiments of the present application provide a method for increasing an accuracy of phase measurement, to improve the accuracy of phase measurement.

Correspondingly, the embodiments of the present application further provide a device for increasing an accuracy of phase measurement, for the implementation and application of the above method.

In order to solve the above problems, the present application discloses a method for increasing an accuracy of phase measurement, particularly comprising: receiving a measurement signal, wherein the measurement signal is generated according to a frequency-domain calibration sequence, the frequency-domain calibration sequence comprises N frequency-domain calibration signals, each of the frequency-domain calibration signals corresponds to one specified frequency point, the specified frequency points are within a specified frequency band, and N is an integer greater than 1; performing frequency-domain transformation to the measurement signal to obtain a frequency-domain measurement sequence, wherein the frequency-domain measurement sequence comprises N frequency-domain measurement signals, and each of the frequency-domain measurement signals corresponds to one specified frequency point; determining phases that correspond to the frequency-domain measurement signals, and determining a phase difference between frequency-domain measurement signals that correspond to two neighboring specified frequency points; according to the phases, the phase difference and a window function, performing sliding-window-type phase fitting to the frequency-domain measurement sequence, to obtain phase-fitting data that correspond to sliding windows; and according to the phase-fitting data of the sliding windows, determining phase-calibration data that correspond to the sliding windows, and, by using the phase-calibration data of the sliding windows, forming phase-calibration data within the specified frequency band.

Optionally, the step of, according to the phases, the phase difference and the window function, performing the sliding-window-type phase fitting to the frequency-domain measurement sequence, to obtain the phase-fitting data that correspond to the sliding windows comprises: by using the window function, according to a preset sliding step length, sliding on the frequency-domain measurement sequence; and after a corresponding sliding window has been obtained after each time of the sliding, according to the phases and the phase difference, performing linear fitting to the phases of the frequency-domain measurement signals within the sliding window, to obtain the phase-fitting data of the sliding windows.

Optionally, the phase-fitting data comprise a phase-linear-fitting function, and the step of, according to the phases and the phase difference, performing the linear fitting to the phases of the frequency-domain measurement signals within the sliding window, to obtain the phase-fitting data of the sliding windows comprises: according to the phases that correspond to the frequency-domain measurement signals within each sliding window of the sliding windows, determining an initial phase value; according to the phase difference between frequency-domain measurement signals that correspond to two neighboring specified frequency points within the sliding window, determining a fitting slope; and according to the initial phase value and the fitting slope, determining the phase-linear-fitting function that corresponds to the sliding window.

Optionally, the step of determining the phases that correspond to the frequency-domain measurement signals, and determining the phase difference between frequency-domain measurement signals that correspond to two neighboring specified frequency points comprises: performing channel estimation to the frequency-domain measurement sequence, to obtain frequency-domain channel responses that correspond to the frequency-domain measurement signals, wherein each of the frequency-domain channel responses corresponds to one specified frequency point; determining phases that correspond to the frequency-domain channel responses; and according to the phases that correspond to the frequency-domain channel responses, determining the phases that correspond to the frequency-domain measurement signals and the phase difference between frequency-domain measurement signals that correspond to two neighboring specified frequency points.

Optionally, the step of determining the phases that correspond to the frequency-domain channel responses comprises: performing time-domain transformation individually to the frequency-domain channel responses, to obtain corresponding time-domain functions; performing windowing-and-noise-suppression processing individually to the time-domain functions; performing frequency-domain transformation individually to the time-domain functions that have been windowing-and-noise-suppression-processed, to obtain frequency-domain functions; and calculating to obtain phases that correspond to the frequency-domain functions.

The embodiments of the present application further provide a device for increasing an accuracy of phase measurement, particularly comprising: a signal receiving module configured for receiving a measurement signal, wherein the measurement signal is generated according to a frequency-domain calibration sequence, the frequency-domain calibration sequence comprises N frequency-domain calibration signals, each of the frequency-domain calibration signals corresponds to one specified frequency point, the specified frequency points are within a specified frequency band, and N is an integer greater than 1; a frequency-domain transforming module configured for performing frequency-domain transformation to the measurement signal to obtain a frequency-domain measurement sequence, wherein the frequency-domain measurement sequence comprises N frequency-domain measurement signals, and each of the frequency-domain measurement signals corresponds to one specified frequency point; a phase determining module configured for determining phases that correspond to the frequency-domain measurement signals, and determining a phase difference between frequency-domain measurement signals that correspond to two neighboring specified frequency points; a phase fitting module configured for, according to the phases, the phase difference and a window function, performing sliding-window-type phase fitting to the frequency-domain measurement sequence, to obtain phase-fitting data that correspond to sliding windows; and a calibration-data determining module configured for, according to the phase-fitting data of the sliding windows, determining phase-calibration data that correspond to the sliding windows, and, by using the phase-calibration data of the sliding windows, forming phase-calibration data within the specified frequency band.

Optionally, the phase fitting module comprises: a sliding module configured for, by using the window function, according to a preset sliding step length, sliding on the frequency-domain measurement sequence; and a phase fitting module configured for, after a corresponding sliding window has been obtained after each time of the sliding, according to the phases and the phase difference, performing linear fitting to the phases of the frequency-domain measurement signals within the sliding window, to obtain the phase-fitting data of the sliding windows.

Optionally, the phase-fitting data comprise a phase-linear-fitting function, and the phase fitting module is configured for, according to the phases that correspond to the frequency-domain measurement signals within each sliding window of the sliding windows, determining an initial phase value; according to the phase difference between frequency-domain measurement signals that correspond to two neighboring specified frequency points within the sliding window, determining a fitting slope; and according to the initial phase value and the fitting slope, determining the phase-linear-fitting function that corresponds to the sliding window.

Optionally, the phase determining module comprises: a channel-estimation module configured for performing channel estimation to the frequency-domain measurement sequence, to obtain frequency-domain channel responses that correspond to the frequency-domain measurement signals, wherein each of the frequency-domain channel responses corresponds to one specified frequency point; a response-phase module configured for determining phases that correspond to the frequency-domain channel responses; and a signal-phase determining module configured for, according to the phases that correspond to the frequency-domain channel responses, determining the phases that correspond to the frequency-domain measurement signals and the phase difference between frequency-domain measurement signals that correspond to two neighboring specified frequency points.

Optionally, the response-phase module is configured for performing time-domain transformation individually to the frequency-domain channel responses, to obtain corresponding time-domain functions; performing windowing-and-noise-suppression processing individually to the time-domain functions; performing frequency-domain transformation individually to the time-domain functions that have been windowing-and-noise-suppression-processed, to obtain frequency-domain functions; and calculating to obtain phases that correspond to the frequency-domain functions.

As compared with the prior art, the embodiments of the present application have the following advantages:

In the embodiments of the present application, after the receiver has received the measurement signal, the method may comprise firstly performing frequency-domain transformation to the measurement signal to obtain a frequency-domain measurement sequence, then determining the phases that correspond to the frequency-domain measurement signals, and determining the phase difference between frequency-domain measurement signals that correspond to two neighboring specified frequency points. Further, in the process of the phase fitting, the method may comprise according to the phases, the phase difference and a window function, performing sliding-window-type phase fitting to the frequency-domain measurement sequence, to obtain the phase-fitting data that correspond to the sliding windows, wherein each of the sliding windows may correspond to one sub-frequency band of the specified frequency band, which realizes that phase fitting is performed each time to the phases within the sub-frequency band. Subsequently, the process comprises, according to the phase-fitting data of the sliding windows, determining the phase-calibration data that correspond to the sliding windows, and, by using the phase-calibration data of the sliding windows, forming the phase-calibration data within the specified frequency band. In other words, the phase-calibration data of the specified frequency band are formed by the phase-calibration data of the sub-frequency bands. The phases within the sub-frequency bands, as compared with the phases within the whole specified frequency band, tend to be more linear, so, as compared with one time of fitting of the whole specified frequency band as in the prior art, the embodiments of the present application can reduce the error of fitting, and increase the accuracy of the phase calibration.

The above description is merely a summary of the technical solutions of the present application. In order to more clearly know the elements of the present application to enable the implementation according to the contents of the description, and in order to make the above and other purposes, features and advantages of the present application more apparent and understandable, the particular embodiments of the present application are provided below.

BRIEF DESCRIPTION OF THE DRAWINGS

In order to more clearly illustrate the technical solutions of the embodiments of the present application or the prior art, the figures that are required to describe the embodiments or the prior art will be briefly introduced below. Apparently, the figures that are described below are embodiments of the present application, and a person skilled in the art can obtain other figures according to these figures without paying creative work.

FIG. 1 is a flow chart of the steps of an embodiment of the method for increasing an accuracy of phase measurement according to the present application;

DETAILED DESCRIPTION OF THE EMBODIMENTS

Figure 2:
FIG. 2 is a flow chart of the steps of an alternative embodiment of the method for increasing an accuracy of phase measurement according to the present application.

In order to make the objects, the technical solutions and the advantages of the embodiments of the present application clearer, the technical solutions of the embodiments of the present application will be clearly and completely described below with reference to the drawings of the embodiments of the present application. Apparently, the described embodiments are merely certain embodiments of the present application, rather than all of the embodiments. All of the other embodiments that a person skilled in the art obtains on the basis of the embodiments of the present application without paying creative work fall within the protection scope of the present application.

One of the core concepts of the embodiments of the present application is that a specified frequency band may be divided into a plurality of sub-frequency bands, then the phases within the sub-frequency bands are individually fitted, to obtain phase-calibration data that correspond to the sub-frequency bands, and then the phase-calibration data of the specified frequency band are formed by the phase-calibration data of the sub-frequency bands. The phases within the sub-frequency bands, as compared with the phases within the whole specified frequency band, tend to be more linear, so, as compared with one time of fitting of the whole specified frequency band as in the prior art, the embodiments of the present application can reduce the error of fitting, and increase the accuracy of the phase calibration.

Referring to FIG. 1, FIG. 1 shows a flow chart of the steps of an embodiment of the method for increasing an accuracy of phase measurement according to the present application, which may particularly comprise the following steps:

Step 101: receiving a measurement signal, wherein the measurement signal is generated according to a frequency-domain calibration sequence, the frequency-domain calibration sequence comprises N frequency-domain calibration signals, each of the frequency-domain calibration signals corresponds to one specified frequency point, the specified frequency points are within a specified frequency band, and N is an integer greater than 1.

In an embodiment of the present application, a transmitter may send a signal within the specified frequency band to a receiver, and the receiver may determine the phase-calibration data within the specified frequency band according to the received signal. The signal emitted by the transmitter and the signal received by the receiver are time-domain signals. The specified frequency band may be set according to the demands. For example, if both of the receiver and the transmitter are configured in the 4th Generation communication system (4G), the specified frequency band may be a frequency band that corresponds to the 4G communication system. The transmitter may generate the time-domain signal according to a frequency-domain calibration sequence, and the frequency-domain calibration sequence may be formed by N frequency-domain calibration signals that have intervals of a preset frequency. Each of the frequency-domain calibration signals may correspond to one specified frequency point within the specified frequency band. N is an integer greater than 1. The preset frequency may be set according to the demands. In an embodiment of the present application, because in the transmission process the signal is influenced by various factors in the transmission medium, which results in that the signal received by the receiver and the signal emitted by the transmitter are not completely the same, the time-domain signal generated by the transmitter according to the frequency-domain calibration sequence may be referred to as a reference signal, and the time-domain signal received by the receiver may be referred to as a measurement signal.

Step 102: performing frequency-domain transformation to the measurement signal to obtain a frequency-domain measurement sequence, wherein the frequency-domain measurement sequence comprises N frequency-domain measurement signals, and each of the frequency-domain measurement signals corresponds to one specified frequency point.

After the measurement signal has been received by the receiver, frequency-domain transformation may be performed to the measurement signal to obtain a corresponding frequency-domain signal. The frequency-domain signal corresponding to the measurement signal may be a frequency-domain sequence (in order to distinguish from the above-described frequency-domain calibration sequence, the frequency-domain sequence may be referred to as a frequency-domain measurement sequence), and the frequency-domain measurement sequence may be formed by the frequency-domain measurement signals that correspond to the N specified frequency points. Subsequently, the phase-calibration data that correspond to the specified frequency band may be determined by analyzing and processing the frequency-domain signal.

Step 103: determining phases that correspond to the frequency-domain measurement signals, and determining a phase difference between frequency-domain measurement signals that correspond to two neighboring specified frequency points.

Step 104: according to the phases, the phase difference and a window function, performing sliding-window-type phase fitting to the frequency-domain measurement sequence, to obtain phase-fitting data that correspond to sliding windows.

In an embodiment of the present application, after the frequency-domain measurement sequence that corresponds to the measurement signal has been determined, the process may comprise firstly determining the phases that correspond to the frequency-domain measurement signals in the frequency-domain measurement sequence and the phase difference between the frequency-domain measurement signals that correspond to two neighboring specified frequency points; and then, according to the phases and the phase difference, performing phase fitting to the frequency-domain measurement sequence. For example, the process may comprise performing channel estimation to the frequency-domain measurement sequence, and determining the phases and the phase difference according to the result of the channel estimation.

In an embodiment of the present application, the phase fitting to the frequency-domain measurement sequence may employ the approach of sliding-window-type phase fitting. The sliding-window-type phase fitting may refer to sliding a window function on the frequency-domain measurement sequence, and then fitting the phases of the frequency-domain measurement sequence within the sliding window that is obtained after each time of the sliding of the window function, to obtain the phase-fitting data that correspond to the sliding windows. The phases of the frequency-domain measurement signals within each of the sliding windows may be fitted according to the phases that correspond to the frequency-domain measurement signals within the sliding window, and the phase difference between the frequency-domain measurement signals that correspond to two neighboring specified frequency points. The type of the window function may be set according to demands, for example Hamming window, Hanning window and so on, which is not limited in the present application. Each time the window function slides once on the frequency-domain measurement sequence, the corresponding sliding window may correspond to one sub-frequency band; in other words, the window function, in the process of sliding on the frequency-domain measurement sequence, may divide the specified frequency band into a plurality of sub-frequency bands. Therefore, the phase-fitting data that correspond to the sliding windows are also the phase-fitting data that correspond to the corresponding sub-frequency bands, and each of the phase-fitting data may correspond to one sub-frequency band.

Step 105: according to the phase-fitting data of the sliding windows, determining phase-calibration data that correspond to the sliding windows, and, by using the phase-calibration data of the sliding windows, forming phase-calibration data within the specified frequency band.

Regarding each of the sliding windows, the process may comprise, according to the phase-fitting data of the sliding window, determining its corresponding phase-calibration data, and then combining the phase-calibration data of the sliding windows, to obtain the phase-calibration data within the specified frequency band. Accordingly, in practical applications, after the receiver has received the signal of the specified frequency band emitted by the transmitter, the phase of the received signal may be calibrated according to the phase-calibration data within the specified frequency band.

In the embodiments of the present application, after the receiver has received the measurement signal, the method may comprise firstly performing frequency-domain transformation to the measurement signal to obtain a frequency-domain measurement sequence, then determining the phases that correspond to the frequency-domain measurement signals, and determining the phase difference between frequency-domain measurement signals that correspond to two neighboring specified frequency points. Further, in the process of the phase fitting, the method may comprise according to the phases, the phase difference and a window function, performing sliding-window-type phase fitting to the frequency-domain measurement sequence, to obtain the phase-fitting data that correspond to the sliding windows, wherein each of the sliding windows may correspond to one sub-frequency band of the specified frequency band, which realizes that phase fitting is performed each time to the phases within the sub-frequency band. Subsequently, the process comprises, according to the phase-fitting data of the sliding windows, determining the phase-calibration data that correspond to the sliding windows, and, by using the phase-calibration data of the sliding windows, forming the phase-calibration data within the specified frequency band. In other words, the phase-calibration data of the specified frequency band are formed by the phase-calibration data of the sub-frequency bands. The phases within the sub-frequency bands, as compared with the phases within the whole specified frequency band, tend to be more linear, so, as compared with one time of fitting of the whole specified frequency band as in the prior art, the embodiments of the present application can reduce the error of fitting, and increase the accuracy of the phase calibration.

In another embodiment of the present application, each of the sub-frequency bands of the specified frequency band may be considered as linear, and then the phase fitting is performed to the frequency-domain measurement sequence, wherein the phase fitting to the frequency-domain measurement sequence may be linear fitting to the phases.

Referring to FIG. 2, FIG. 2 shows a flow chart of the steps of an alternative embodiment of the method for increasing an accuracy of phase measurement according to the present application, which may particularly comprise the following steps:

Step 201: receiving a measurement signal.

Step 202: performing frequency-domain transformation to the measurement signal to obtain a frequency-domain measurement sequence, wherein the frequency-domain measurement sequence comprises N frequency-domain measurement signals.

Figure 3A:
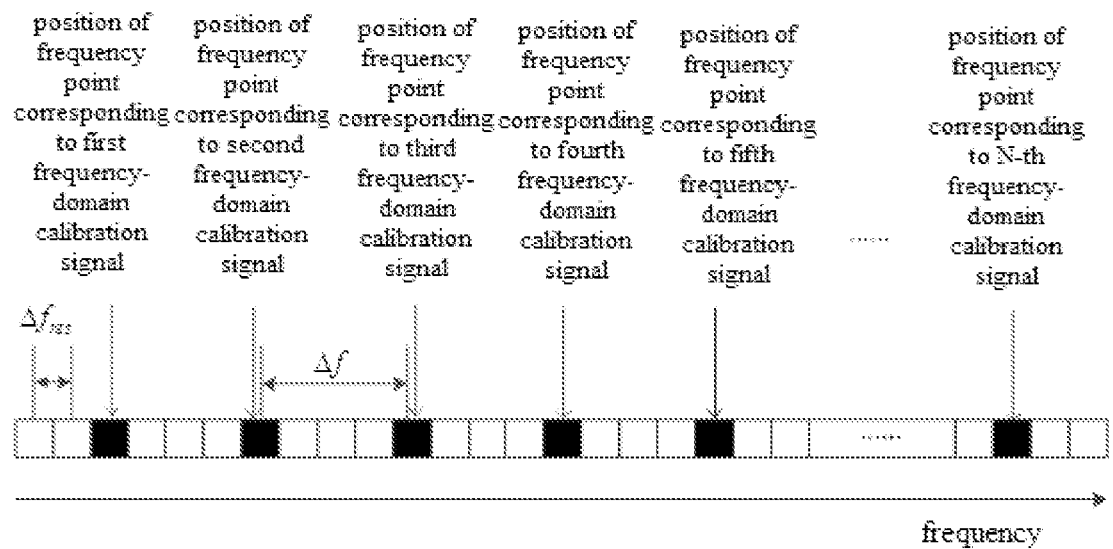
FIG. 3A is a schematic diagram of the frequency positions that correspond to the frequency-domain calibration signals in the frequency-domain calibration sequence according to an embodiment of the present application.
Figure 3B:
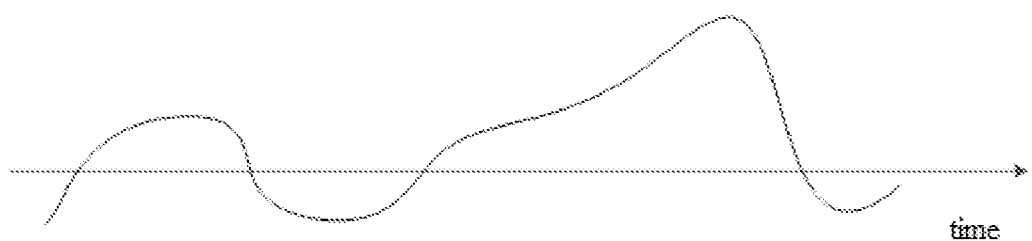
FIG. 3B is a schematic diagram of the reference signal according to an embodiment of the present application.
Figure 3C:
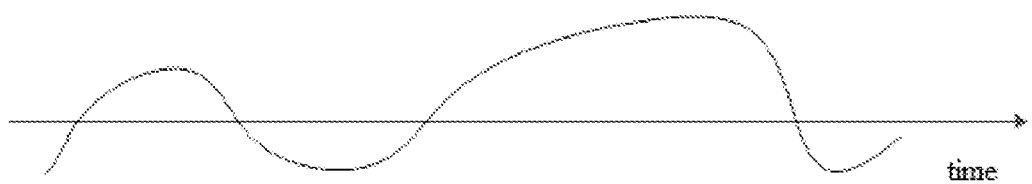
FIG. 3C is a schematic diagram of the measurement signal according to an embodiment of the present application.

In an embodiment of the present application, the transmitter may determine the frequency-domain calibration sequence, perform time-domain transformation to the frequency-domain calibration sequence, to obtain the reference signal, and emit the reference signal, and in turn the receiver may receive the corresponding measurement signal. The frequency difference between two neighboring frequency-domain calibration signals in the frequency-domain calibration sequence may be set to be the preset frequency. The positions of the frequency points that correspond to the frequency-domain calibration signals in the frequency-domain calibration sequence are shown in FIG. 3A, wherein the black square blocks are the positions of the frequency points that correspond to the frequency-domain calibration signals in the frequency-domain calibration sequence, and the white square blocks are the positions of the other frequency points. XXX is the preset frequency, YYY, and ZZZ is the frequency interval between the signals in practical applications. By performing time-domain transformation to the frequency-domain calibration sequence corresponding to FIG. 3A, the reference signal shown in FIG. 3B may be obtained, and the transmitter may emit the reference signal shown in FIG. 3B. Correspondingly, the measurement signal that the receiver may receive is shown in FIG. 3C. The signals in FIG. 3B and in FIG. 3C are different.

Figure 3D:
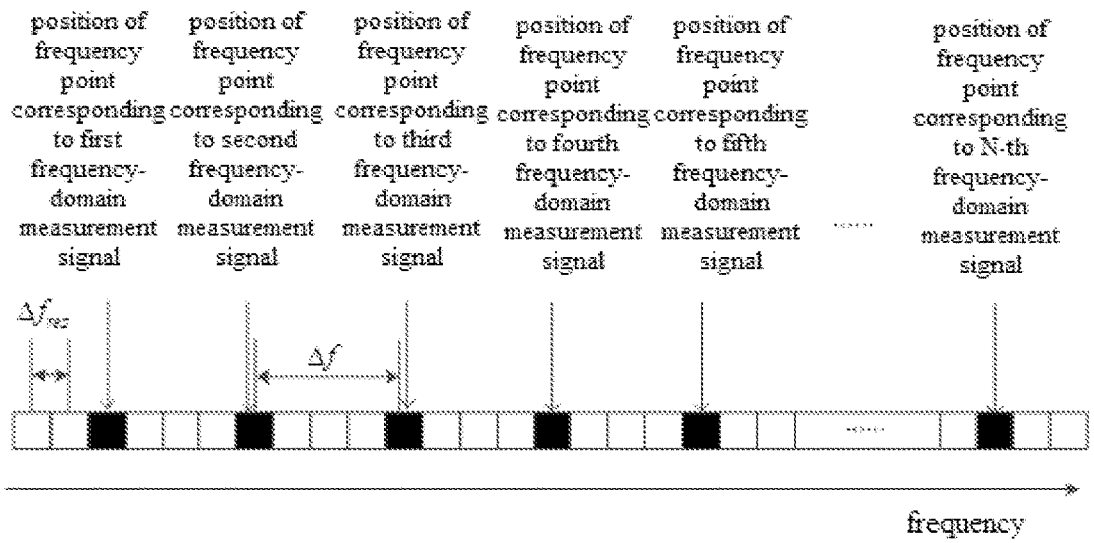
FIG. 3D is a schematic diagram of the frequency positions that correspond to the frequency-domain measurement signals in the frequency-domain measurement sequence according to an embodiment of the present application.

Subsequently, frequency-domain transformation may be performed to the measurement signal to obtain a frequency-domain signal. The frequency-domain signal may be a frequency-domain measurement sequence, and the frequency-domain measurement sequence may comprise N frequency-domain measurement signals. Further, the phases of the frequency-domain measurement signals in the frequency-domain sequence may be fitted. For example, after the receiver has received the measurement signal in FIG. 3C, the receiver may perform frequency-domain transformation to the measurement signal in FIG. 3C, to obtain the corresponding frequency-domain measurement sequence. The positions of the frequency points that correspond to the frequency-domain measurement signals in the frequency-domain measurement sequence are shown in FIG. 3D. In FIG. 3D the positions of the frequency points that correspond to the frequency-domain measurement signals are the same as the positions of the frequency points that correspond to the frequency-domain calibration signals in FIG. 3A, but the frequency-domain measurement signals and the frequency-domain calibration signals of the corresponding frequencies are different (not shown in the figure).

The process of the phase fitting to the frequency-domain measurement sequence may comprise firstly determining the phases of the frequency-domain measurement signals in the frequency-domain measurement sequence, and then, according to the phases of the frequency-domain measurement signals, performing sliding-window-type phase fitting to the frequency-domain measurement sequence, to determine the phase-fitting data of the sliding windows. The step of determining the phases of the frequency-domain measurement signals in the frequency-domain measurement sequence may particularly refer to the steps 203-205.

Step 203: performing channel estimation to the frequency-domain measurement sequence, to obtain frequency-domain channel responses that correspond to the frequency-domain measurement signals.

Step 204: determining phases that correspond to the frequency-domain channel responses.

Step 205: according to the phases that correspond to the frequency-domain channel responses, determining the phases that correspond to the frequency-domain measurement signals and the phase difference between frequency-domain measurement signals that correspond to two neighboring specified frequency points.

An embodiment of the present application may comprise performing channel estimation to the frequency-domain measurement sequence, and calculating the frequency-domain channel responses that correspond to the frequency-domain measurement signals in the frequency-domain measurement sequence; and then, according to the frequency-domain channel responses that correspond to the frequency-domain measurement signals, determining the phases of the frequency-domain measurement signals. The frequency-domain measurement signals in the frequency-domain measurement sequence may be multiplied by the frequency-domain calibration signals of the corresponding frequencies in the frequency-domain calibration sequence, to obtain the frequency-domain channel responses that correspond to the frequency-domain measurement signals. Subsequently, the process may comprise calculating the phases that correspond to the frequency-domain channel responses, and using the phases of the frequency-domain channel responses as the phases of the corresponding frequency-domain measurement signals; and calculating the phase difference between the corresponding frequency-domain channel responses of two neighboring specified frequency points, and using the phase difference as the phase difference between the corresponding frequency-domain measurement signals of the two neighboring specified frequency points.

The following sub-steps may be referred to in order to realize determining the phases that correspond to the frequency-domain channel responses:

Step 41: performing time-domain transformation individually to the frequency-domain channel responses, to obtain corresponding time-domain functions.

Step 42: performing windowing-and-noise-suppression processing individually to the time-domain functions.

Step 43: performing frequency-domain transformation individually to the time-domain functions that have been windowing-and-noise-suppression-processed, to obtain frequency-domain functions.

Step 44: calculating to obtain phases that correspond to the frequency-domain functions.

The frequency-domain channel response that corresponds to the i-th frequency-domain measurement signal in the frequency-domain measurement sequence may be expressed as $H_{est}(i)$, and regarding the subsequent frequency-domain channel responses starting from the second frequency-domain channel response, the corresponding frequencies are $\Delta f*i+f_{init}$, wherein $\Delta f$ is a preset frequency, $f_{init}$ is the frequency of the first frequency-domain channel response, and i is an integer greater than 0 and not greater than N. Subsequently, time-domain transformation is performed to the frequency-domain channel responses, to obtain the time-domain functions that correspond to the frequency-domain channel responses, which may be expressed as $h_{est}(i)$. Subsequently, the process may comprise performing windowing-and-noise-suppression processing individually to the time-domain functions $h_{est}(i)$, to obtain time-domain functions that have been windowing-and-noise-suppression-processed, which may be expressed as $h_{est}'(i)$. For example, a simple method of time-domain windowing is reserving N/4 sampling points around the peak value, which may comprise maintaining $N*1/16$ preceding the peak value and $N*3/16$ subsequent to the peak value and setting all of the remaining to be 0. In the embodiments of the present application, the window function of the windowing-and-noise-suppression processing and the mode of the windowing are not limited. Subsequently, frequency-domain transformation is performed individually to the time-domain functions that have been windowing-and-noise-suppression-processed, to obtain the corresponding frequency-domain functions, which may be expressed as $H_{est}'(i)$ Subsequently, the phases that correspond to the frequency-domain functions $H_{est}'(i)$ may be calculated, which may be expressed as $\phi(i)$, and the phase difference $\Delta\phi(j)$ between the frequency-domain functions that correspond to two neighboring frequency points FFFF may be calculated, wherein j is an integer greater than 0 and not greater than N−1. Further, the phases $\phi(i)$ that correspond to the frequency-domain measurement signals and the phase difference $\Delta\phi(j)$ between the frequency-domain measurement signals that correspond to two neighboring specified frequency points are obtained.

Step 206: by using the window function, according to a preset sliding step length, sliding on the frequency-domain measurement sequence.

Step 207: after a corresponding sliding window has been obtained after each time of the sliding, according to the phases and the phase difference, performing linear fitting to the phases of the frequency-domain measurement signals within the sliding window, to obtain the phase-fitting data of the sliding windows.

An embodiment of the present application may comprise sliding a window function on the frequency-domain measurement sequence, and, after each time of the sliding of the window function, according to the phases of the frequency-domain measurement signals within the sliding window and the phase difference between the frequency-domain measurement signals that correspond to two neighboring frequency points, fitting the phases of the frequency-domain measurement signals within the sliding window, to determine the phase-fitting data that correspond to the sliding window. The length of the window function may be set according to demands, for example, $n*\Delta f$. The distance by which the window function slides on the frequency-domain measurement sequence may be used as the sliding distance, and may also be set according to demands, for example, $m*\Delta f$, wherein m and n are integers greater than 0, m≤n, and n is far less than N.

The phases of the frequency-domain measurement signals within each of the sliding windows may be considered as linear, and therefore linear fitting may be performed to the phases of the frequency-domain measurement signals within the sliding window, to obtain the corresponding phase-fitting data. The phase-fitting data may comprise a phase-linear-fitting function, which may be expressed by using the formula $\phi w((L_w/2)+\Delta L)=\phi_{init}+k_\phi(\Delta L)$, wherein $\Delta L=(f-f_w)/\Delta f_{res}$, $L_w/2=f_w/\Delta f_{res}$, f is the frequencies of the frequency-domain measurement signals, $f_w$ is the center frequency of the window function, and $\Delta f_{res}$ is the frequency interval between the signals in practical applications; and $\phi_{init}$ is the initial phase value, and $k_\phi$ is the fitting slope, both of which are a constant. Therefore, the corresponding $\phi_{init}$ and $k_\phi$ may be determined according to the phases of the frequency-domain measurement signals within the sliding window, and the phase-fitting data that correspond to the sliding window may be obtained.

The following sub-steps may be referred to in order to determine the phase-fitting data that correspond to the sliding window:

Sub-step 71: Regarding each of the sliding windows, according to the phases of the frequency-domain measurement signals within the sliding window, determining an initial phase value.

Sub-step 72: according to the phase difference between frequency-domain measurement signals that correspond to two neighboring specified frequency points within the sliding window, determining a fitting slope.

Sub-step 73: according to the initial phase value and the fitting slope, determining the phase-linear-fitting function that corresponds to the sliding window.

In an embodiment of the present application, regarding each of the sliding windows, the initial phase value may be determined according to the phases of the frequency-domain measurement signals within the sliding window. The process may comprise calculating the average value of the phases that correspond to the frequency-domain measurement signals within the sliding window, and using the average value of the phases as the initial phase value, which is the above-described $\phi_{init}$. Subsequently, the fitting slope may be determined according to the phase difference between the frequency-domain measurement signals that correspond to two neighboring specified frequency points within the sliding window. The process may comprise calculating the average value of the phase differences between the frequency-domain measurement signals that correspond to randomly two neighboring specified frequency points, and using the average value of the phase differences as the fitting slope, which is the above-described $k_\phi$.

Figure 3E:
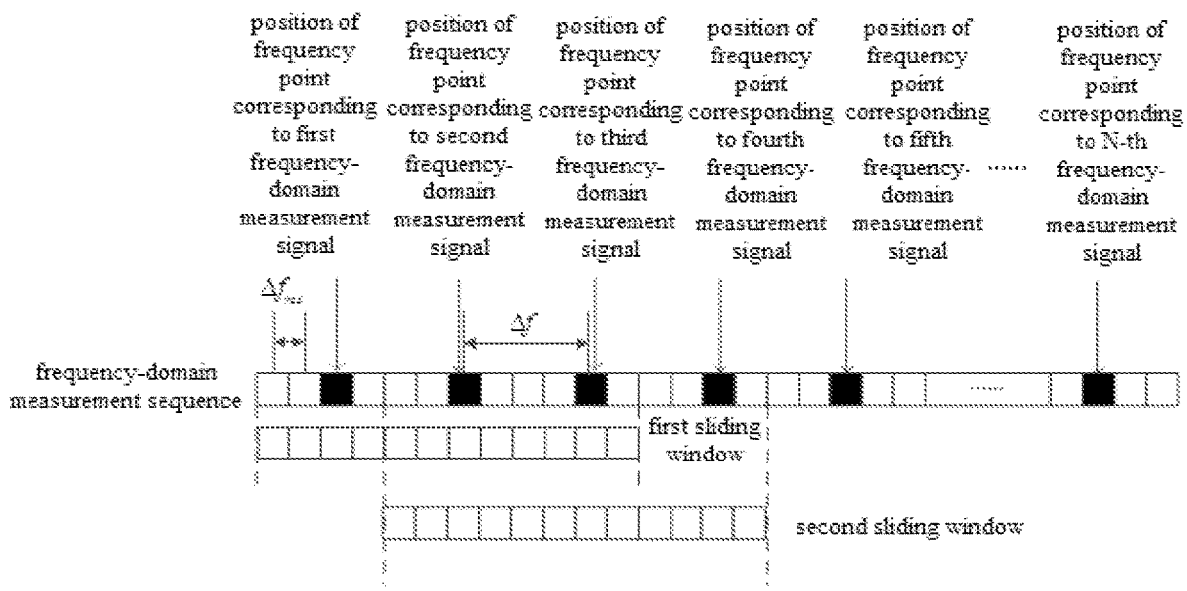
FIG. 3E is a schematic diagram of the sliding windows according to an embodiment of the present application.

In an example of the present application, the length of the window function is $n*\Delta f$ and the sliding step length is $m*\Delta f$. Accordingly, after each time of the window sliding, the phases of n frequency-domain measurement signals within the sliding window are fitted. As shown in FIG. 3E, N is 3, m is 1, the first sliding window may perform phase fitting to the first frequency-domain measurement signal, the second frequency-domain measurement signal and the third frequency-domain measurement signal, wherein $\phi_{init}=(\phi(1)+\phi(2)+\phi(3))/3$ and $k_\phi=(\Delta\phi(1)+\Delta\phi(2))/2$. Similarly, the second sliding window may perform phase fitting to the second frequency-domain measurement signal, the third frequency-domain measurement signal and the fourth frequency-domain measurement signal, whereby it may be obtained that $\phi_{init}=(\phi(2)+\phi(3)+\phi(4))/3$ and $k_\phi=(\Delta\phi(2)+\Delta\phi(3))/2$. The rest can be done in the same manner, to obtain the phase-linear-fitting functions that correspond to the sliding windows.

Step 208: according to the phase-fitting data of the sliding windows, determining phase-calibration data that correspond to the sliding windows, and, by using the phase-calibration data of the sliding windows, forming phase-calibration data within the specified frequency band.

Subsequently, the phase-fitting data of the sliding windows may be determined, and the phase-calibration data that correspond to the sliding windows may be determined, by modes such as table looking-up and Coordinate Rotation Digital Computer (CORDIC). For example, if the phase-linear-fitting function that corresponds to the p-th sliding window is $\phi w_p((L_w/2)+\Delta L)=\phi_{init}+k_\phi(\Delta L)$, then the phase-calibration data that correspond to the p-th sliding window may be $w_p((L_w/2)+\Delta L)=\exp(-j*\phi w_p((L_w/2)+\Delta L))$, wherein p is an integer greater than 0 and not greater than $(N-n)/m$. Subsequently, by using the phase-calibration data of the sliding windows, the phase-calibration data within the specified frequency band are formed. For example, the phase-calibration data within the specified frequency band include: $\{w_1((L_w/2)+\Delta L), w_2((L_w/2)+\Delta L), w_3((L_w/2)+\Delta L), \ldots, w_{(N-n)/m}((L_w/2)+\Delta L)\}$.

Figure 3F:
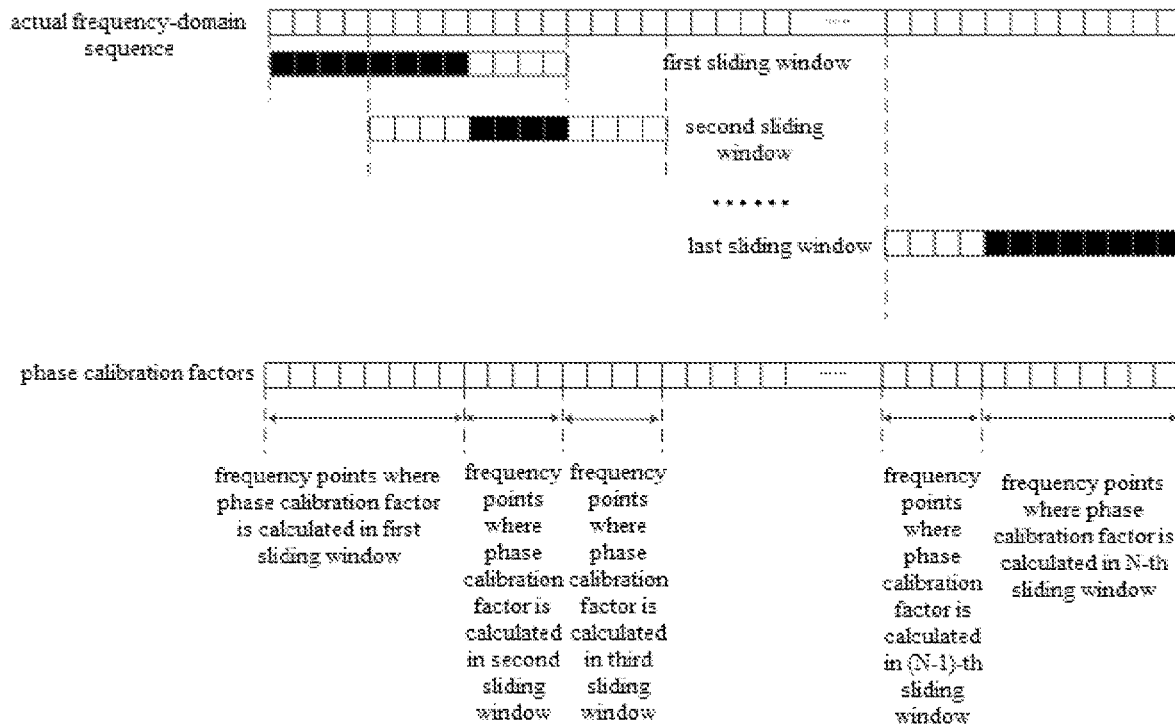
FIG. 3F is a schematic diagram for calculating the phase calibration factors of the frequency points in the actual frequency-domain sequence according to an embodiment of the present application.

In an alternative embodiment of the present application, when the transmitter is emitting an actual signal within the specified frequency band, the receiver may, according to the phase-calibration data that correspond to the specified frequency band, calculate the phase calibration factors that correspond to the frequency points within the specified frequency band, and then, according to the phase calibration factors that correspond to the frequency points, perform phase calibration to the received signal. In the process of calculating the phase calibration factors that correspond to the frequency points, regarding the sliding windows at the edges of the bandwidth of the specified frequency band, it is required to calculate the phase calibration factor that corresponds to $(n+m)/2*\Delta f$ frequency points within the sliding window that are adjacent to an upper edge or lower edge, and, regarding the sliding windows that are not at the edges of the bandwidth of the specified frequency band, it is required to calculate the phase calibration factor that corresponds to m*Δf frequency points in the middle of the sliding window. As shown in FIG. 3F, the phase calibration factors of the frequency points of the actual frequency-domain sequence that corresponds to the actual signal are calculated, wherein n=3 and m=1. Therefore, in the first sliding window calculated is the phase calibration factor that corresponds to $2*\Delta f=8*f_{res}$ frequency points that are adjacent to the upper edge, in the second sliding window calculated is the phase calibration factor that corresponds to $\Delta f=4*f_{res}$ frequency points in the middle, . . . , and in the last one sliding window calculated is the phase calibration factor that corresponds to $2*\Delta f=8*f_{res}$ frequency points that are adjacent to the lower edge.

In the embodiments of the present application, after the receiver has received the measurement signal, the method may comprise firstly performing frequency-domain transformation to the measurement signal to obtain a frequency-domain measurement sequence, then determining the phases that correspond to the frequency-domain measurement signals, and determining the phase difference between frequency-domain measurement signals that correspond to two neighboring specified frequency points. Further, in the process of the phase fitting, the method may comprise according to the phases, the phase difference and a window function, performing sliding-window-type phase fitting to the frequency-domain measurement sequence, to obtain the phase-fitting data that correspond to the sliding windows, wherein each of the sliding windows may correspond to one sub-frequency band of the specified frequency band, which realizes that phase fitting is performed each time to the phases within the sub-frequency band. Subsequently, the process comprises, according to the phase-fitting data of the sliding windows, determining the phase-calibration data that correspond to the sliding windows, and, by using the phase-calibration data of the sliding windows, forming the phase-calibration data within the specified frequency band. In other words, the phase-calibration data of the specified frequency band are formed by the phase-calibration data of the sub-frequency bands. The phases within the sub-frequency bands, as compared with the phases within the whole specified frequency band, tend to be more linear, so, as compared with one time of fitting of the whole specified frequency band as in the prior art, the embodiments of the present application can reduce the error of fitting, and increase the accuracy of the phase calibration.

Further, an embodiment of the present application may comprise, according to the phases of the frequency-domain channel responses that correspond to the frequency-domain measurement signals in the frequency-domain measurement sequence, determining the phases that correspond to the frequency-domain measurement signals, and determining the phase difference between frequency-domain measurement signals that correspond to two neighboring specified frequency points. The process of determining the phases of the frequency-domain channel responses that correspond to the frequency-domain measurement signals may comprise performing time-domain transformation individually to the frequency-domain channel responses, to obtain the corresponding time-domain functions, performing windowing-and-noise-suppression processing individually to the time-domain functions, performing frequency-domain transformation individually to the time-domain functions that have been windowing-and-noise-suppression-processed, to obtain frequency-domain functions, and calculating to obtain phases that correspond to the frequency-domain functions. Further, by performing windowing-and-noise-suppression processing to the frequency-domain channel responses, the accuracy of the phases that correspond to the frequency-domain channel responses is increased, thereby further increasing the accuracy of the phase calibration.

It should be noted that, regarding the process embodiments, for brevity of the description, all of them are expressed as the combination of a series of actions, but a person skilled in the art should know that the embodiments of the present application are not limited by the sequences of the actions that are described, because according to the embodiments of the present application, some of the steps may have other sequences or be performed simultaneously. Secondly, a person skilled in the art should also know that all of the embodiments described in the description are preferable embodiments, and not all of the actions that they involve are required by the embodiments of the present application.

Figure 4:
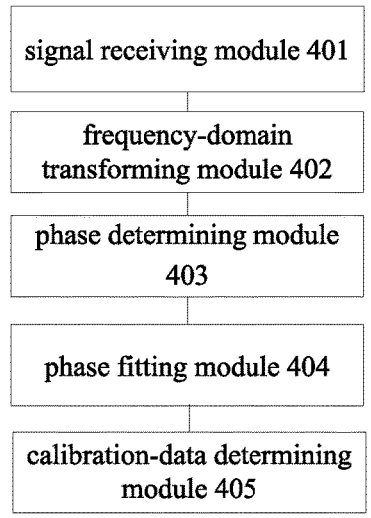
FIG. 4 is a structural block diagram of an embodiment of the device for increasing an accuracy of phase measurement according to the present application.

Referring to FIG. 4, FIG. 4 shows a structural block diagram of an embodiment of the device for increasing an accuracy of phase measurement according to the present application, which may particularly comprise the following modules:

a signal receiving module 401 configured for receiving a measurement signal, wherein the measurement signal is generated according to a frequency-domain calibration sequence, the frequency-domain calibration sequence comprises N frequency-domain calibration signals, each of the frequency-domain calibration signals corresponds to one specified frequency point, the specified frequency points are within a specified frequency band, and N is an integer greater than 1;

a frequency-domain transforming module 402 configured for performing frequency-domain transformation to the measurement signal to obtain a frequency-domain measurement sequence, wherein the frequency-domain measurement sequence comprises N frequency-domain measurement signals, and each of the frequency-domain measurement signals corresponds to one specified frequency point;

a phase determining module 403 configured for determining phases that correspond to the frequency-domain measurement signals, and determining a phase difference between frequency-domain measurement signals that correspond to two neighboring specified frequency points;

a phase fitting module 404 configured for, according to the phases, the phase difference and a window function, performing sliding-window-type phase fitting to the frequency-domain measurement sequence, to obtain phase-fitting data that correspond to sliding windows; and a calibration-data determining module 405 configured for, according to the phase-fitting data of the sliding windows, determining phase-calibration data that correspond to the sliding windows, and, by using the phase-calibration data of the sliding windows, forming phase-calibration data within the specified frequency band.

Figure 5:
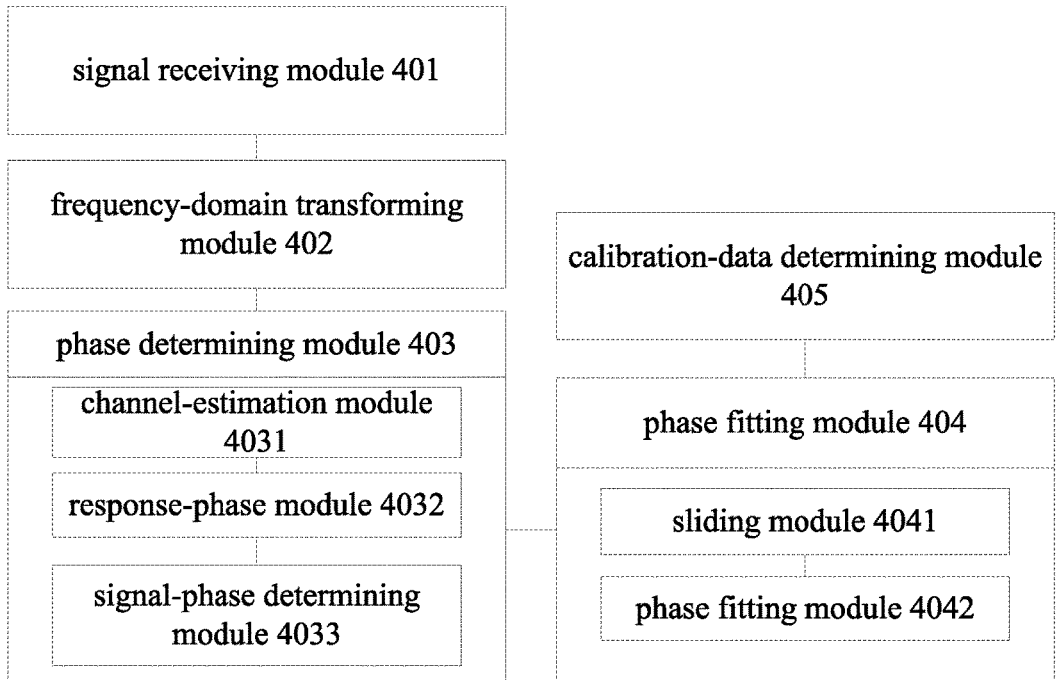
FIG. 5 is a structural block diagram of another embodiment of the device for increasing an accuracy of phase measurement according to the present application.

Referring to FIG. 5, FIG. 5 shows a structural block diagram of another embodiment of the device for increasing an accuracy of phase measurement according to the present application.

In the other embodiment of the present application, the phase fitting module 404 comprises:

a sliding module 4041 configured for, by using the window function, according to a preset sliding step length, sliding on the frequency-domain measurement sequence; and a phase fitting module 4042 configured for, after a corresponding sliding window has been obtained after each time of the sliding, according to the phases and the phase difference, performing linear fitting to the phases of the frequency-domain measurement signals within the sliding window, to obtain the phase-fitting data of the sliding windows.

In another embodiment of the present application, the phase-fitting data comprise a phase-linear-fitting function, and the phase fitting module 4042 is particularly configured for, according to the phases that correspond to the frequency-domain measurement signals within each sliding window of the sliding windows, determining an initial phase value; according to the phase difference between frequency-domain measurement signals that correspond to two neighboring specified frequency points within the sliding window, determining a fitting slope; and according to the initial phase value and the fitting slope, determining the phase-linear-fitting function that corresponds to the sliding window.

In another embodiment of the present application, the phase determining module 403 comprises:

a channel-estimation module 4031 configured for performing channel estimation to the frequency-domain measurement sequence, to obtain frequency-domain channel responses that correspond to the frequency-domain measurement signals, wherein each of the frequency-domain channel responses corresponds to one specified frequency point;

a response-phase module 4032 configured for determining phases that correspond to the frequency-domain channel responses; and a signal-phase determining module 4033 configured for, according to the phases that correspond to the frequency-domain channel responses, determining the phases that correspond to the frequency-domain measurement signals and the phase difference between frequency-domain measurement signals that correspond to two neighboring specified frequency points.

In another embodiment of the present application, the response-phase module 4032 is particularly configured for performing time-domain transformation individually to the frequency-domain channel responses, to obtain corresponding time-domain functions; performing windowing-and-noise-suppression processing individually to the time-domain functions; performing frequency-domain transformation individually to the time-domain functions that have been windowing-and-noise-suppression-processed, to obtain frequency-domain functions; and calculating to obtain phases that correspond to the frequency-domain functions.

In the embodiments of the present application, after the receiver has received the measurement signal, the method may comprise firstly performing frequency-domain transformation to the measurement signal to obtain a frequency-domain measurement sequence, then determining the phases that correspond to the frequency-domain measurement signals, and determining the phase difference between frequency-domain measurement signals that correspond to two neighboring specified frequency points. Further, in the process of the phase fitting, the method may comprise according to the phases, the phase difference and a window function, performing sliding-window-type phase fitting to the frequency-domain measurement sequence, to obtain the phase-fitting data that correspond to the sliding windows, wherein each of the sliding windows may correspond to one sub-frequency band of the specified frequency band, which realizes that phase fitting is performed each time to the phases within the sub-frequency band. Subsequently, the process comprises, according to the phase-fitting data of the sliding windows, determining the phase-calibration data that correspond to the sliding windows, and, by using the phase-calibration data of the sliding windows, forming the phase-calibration data within the specified frequency band. In other words, the phase-calibration data of the specified frequency band are formed by the phase-calibration data of the sub-frequency bands. The phases within the sub-frequency bands, as compared with the phases within the whole specified frequency band, tend to be more linear, so, as compared with one time of fitting of the whole specified frequency band as in the prior art, the embodiments of the present application can reduce the error of fitting, and increase the accuracy of the phase calibration.

Regarding the device embodiments, because they are substantially similar to the process embodiments, they are described simply, and the related parts may refer to the description on the process embodiments.

The above-described device embodiments are merely illustrative, wherein the units that are described as separate components may or may not be physically separate, and the components that are displayed as units may or may not be physical units; in other words, they may be located at the same one location, and may also be distributed to a plurality of network units. Part or all of the modules may be selected according to the actual demands to realize the purposes of the solutions of the embodiments. A person skilled in the art can understand and implement the technical solutions without paying creative work.

Each component embodiment of the present application may be implemented by hardware, or by software modules that are operated on one or more processors, or by a combination thereof. A person skilled in the art should understand that some or all of the functions of some or all of the components of the calculating and processing device according to the embodiments of the present application may be implemented by using a microprocessor or a digital signal processor (DSP) in practice. The present application may also be implemented as apparatus or device programs (for example, computer programs and computer program products) for implementing part of or the whole of the method described herein. Such programs for implementing the present application may be stored in a computer-readable medium, or may be in the form of one or more signals. Such signals may be downloaded from an Internet website, or provided on a carrier signal, or provided in any other forms.

Figure 6:
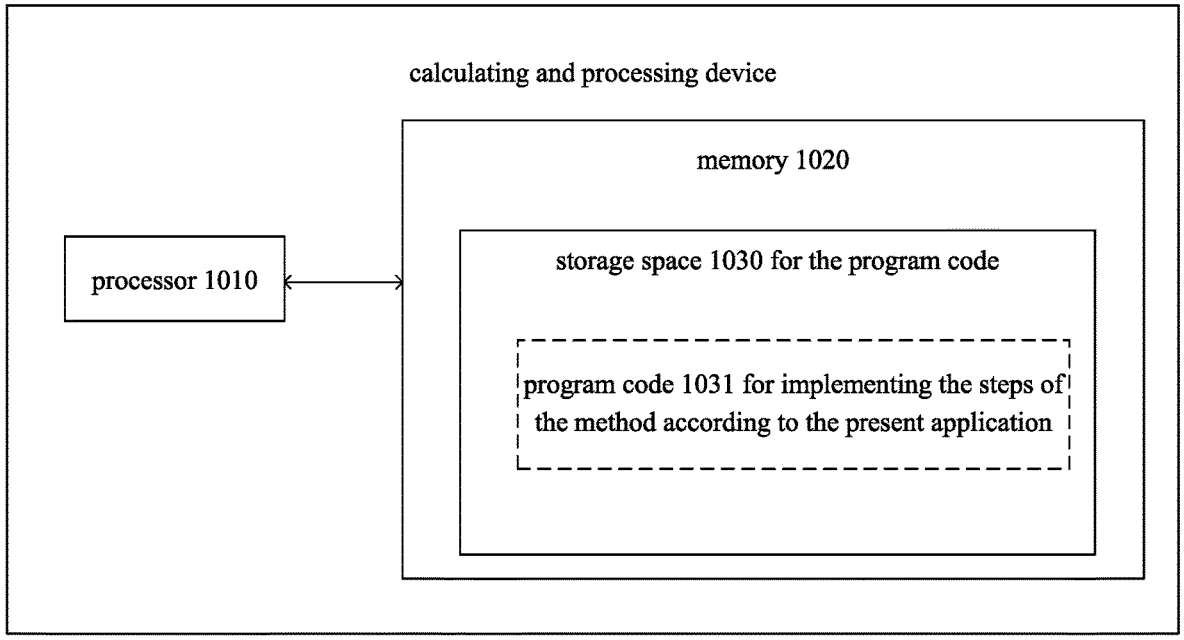
FIG. 6 schematically shows a block diagram of a calculating and processing device for implementing the method according to the present application.
Figure 7:
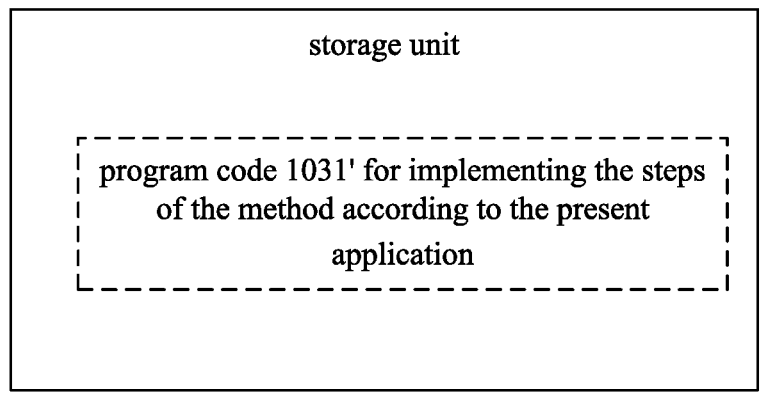
FIG. 7 schematically shows a storage unit for maintaining or carrying a program code for implementing the method according to the present application.

For example, FIG. 6 shows a calculating and processing device that can implement the method according to the present application. The calculating and processing device traditionally comprises a processor 1010 and a computer program product or computer-readable medium in the form of a memory 1020. The memory 1020 may be electronic memories such as flash memory, EEPROM (Electrically Erasable Programmable Read Only Memory), EPROM, hard disk or ROM. The memory 1020 has the storage space 1030 of the program code 1031 for implementing any steps of the above method. For example, the storage space 1031 for program code may contain program codes 1031 for individually implementing each of the steps of the above method. Those program codes may be read from one or more computer program products or be written into the one or more computer program products. Those computer program products include program code carriers such as hard disk, compact disk (CD), memory card or floppy disk as shown in FIG. 7. Such computer program products are usually portable or fixed storage units. The storage unit may have storage segments or storage spaces with similar arrangement to the memory 1020 of the calculating and processing device in FIG. 6. The program codes may for example be compressed in a suitable form. Generally, the storage unit contains a computer-readable code 1031', which can be read by a processor like 1010. When those codes are executed by the calculating and processing device, the codes cause the calculating and processing device to implement each of the steps of the method described above.

The "one embodiment", "an embodiment" or "one or more embodiments" as used herein means that particular features, structures or characteristics described with reference to an embodiment are included in at least one embodiment of the present application. Moreover, it should be noted that here an example using the wording "in an embodiment" does not necessarily refer to the same one embodiment.

The description provided herein describes many concrete details. However, it can be understood that the embodiments of the present application may be implemented without those concrete details. In some of the embodiments, well-known processes, structures and techniques are not described in detail, so as not to affect the understanding of the description.

In the claims, any reference signs between parentheses should not be construed as limiting the claims. The word "comprise" does not exclude elements or steps that are not listed in the claims. The word "a" or "an" preceding an element does not exclude the existing of a plurality of such elements. The present application may be implemented by means of hardware comprising several different elements and by means of a properly programmed computer. In unit claims that list several devices, some of those devices may be embodied by the same item of hardware. The words first, second, third and so on do not denote any order. Those words may be interpreted as names.

Finally, it should be noted that the above embodiments are merely intended to explain the technical solutions of the present application, and not to limit them. Although the present application is explained in detail by referring to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present application.

What is claimed is:

1. A method for increasing an accuracy of a phase measurement, comprising:
    receiving a measurement signal, wherein the measurement signal is generated according to a frequency-domain calibration sequence, the frequency-domain calibration sequence comprises N frequency-domain calibration signals, each of the N frequency-domain calibration signals corresponds to one specified frequency point, specified frequency points are within a specified frequency band, and N is an integer greater than 1;
    performing a frequency-domain transformation to the measurement signal to obtain a frequency-domain measurement sequence, wherein the frequency-domain measurement sequence comprises N frequency-domain measurement signals, and each of the N frequency-domain measurement signals corresponds to one specified frequency point;
    determining phases corresponding to the N frequency-domain measurement signals, and determining a phase difference between the N frequency-domain measurement signals corresponding to two neighboring specified frequency points;
    according to the phases, the phase difference and a window function, performing a sliding-window-type phase fitting to the frequency-domain measurement sequence, to obtain phase-fitting data corresponding to sliding windows; and
    according to the phase-fitting data of the sliding windows, determining phase-calibration data corresponding to the sliding windows, and, by using the phase-calibration data of the sliding windows, forming the phase-calibration data within the specified frequency band.

2. The method according to claim 1, wherein the step of, according to the phases, the phase difference and the window function, performing the sliding-window-type phase fitting to the frequency-domain measurement sequence, to obtain the phase-fitting data corresponding to the sliding windows comprises:
    by using the window function, according to a preset sliding step length, sliding on the frequency-domain measurement sequence; and
    after a corresponding sliding window is obtained after each time of sliding, according to the phases and the phase difference, performing a linear fitting to the phases of the N frequency-domain measurement signals within the corresponding sliding window, to obtain the phase-fitting data of the sliding windows.

3. The method according to claim 2, wherein the phase-fitting data comprise a phase-linear-fitting function, and
    the step of, according to the phases and the phase difference, performing the linear fitting to the phases of the N frequency-domain measurement signals within the corresponding sliding window, to obtain the phase-fitting data of the sliding windows comprises:
    according to the phases corresponding to the N frequency-domain measurement signals within each sliding window of the sliding windows, determining an initial phase value;
    according to the phase difference between the N frequency-domain measurement signals corresponding to the two neighboring specified frequency points within the each sliding window, determining a fitting slope; and
    according to the initial phase value and the fitting slope, determining the phase-linear-fitting function corresponding to the each sliding window.

4. The method according to claim 1, wherein the step of determining the phases corresponding to the N frequency-domain measurement signals, and determining the phase difference between the N frequency-domain measurement signals corresponding to the two neighboring specified frequency points comprises:
    performing a channel estimation to the frequency-domain measurement sequence, to obtain frequency-domain channel responses corresponding to the N frequency-domain measurement signals, wherein each of the frequency-domain channel responses corresponds to one specified frequency point;
    determining the phases corresponding to the frequency-domain channel responses; and
    according to the phases corresponding to the frequency-domain channel responses, determining the phases corresponding to the N frequency-domain measurement signals and the phase difference between the N frequency-domain measurement signals corresponding to the two neighboring specified frequency points.

5. The method according to claim 4, wherein the step of determining the phases corresponding to the frequency-domain channel responses comprises:
performing a tune-domain transformation individually to the frequency-domain channel responses, to obtain corresponding time-domain functions;
performing a windowing-and-noise-suppression processing individually to the corresponding time-domain functions;
performing a frequency-domain transformation individually to the corresponding time-domain functions that have been windowing-and-noise-suppression-processed, to obtain frequency-domain functions; and
calculating to obtain the phases corresponding to the frequency-domain functions.

6. A device for increasing an accuracy of a phase measurement, wherein the device comprises:
a signal receiving module configured for receiving a measurement signal, wherein the measurement signal is generated according to a frequency-domain calibration sequence, the frequency-domain calibration sequence comprises N frequency-domain calibration signals, each of the N frequency-domain calibration signals corresponds to one specified frequency point, specified frequency points are within a specified frequency band, and N is an integer greater than 1,
a frequency-domain transforming module configured for performing a frequency-domain transformation to the measurement signal to obtain a frequency-domain measurement sequence, wherein the frequency-domain measurement sequence comprises N frequency-domain measurement signals, and each of the N frequency-domain measurement signals corresponds to one specified frequency point;
a phase determining module configured for determining phases corresponding to the N frequency-domain measurement signals, and determining a phase difference between the N frequency-domain measurement signals corresponding to two neighboring specified frequency points;
a phase fitting module configured for, according to the phases, the phase difference and a window function, performing a sliding-window-type phase fitting to the frequency-domain measurement sequence, to obtain phase-fitting data corresponding to sliding windows; and
a calibration-data determining module configured for, according to the phase-fitting data of the sliding windows, determining phase-calibration data corresponding to the sliding windows, and, by using the phase-calibration data of the sliding windows, forming the phase-calibration data within the specified frequency band.

7. The device according to claim 6, wherein the phase fitting module comprises:
a sliding module configured for, by using the window function, according to a preset sliding step length, sliding on the frequency-domain measurement sequence; and
a phase fitting module configured for, after a corresponding sliding window is obtained after each time of sliding, according to the phases and the phase difference, performing a linear fitting to the phases of the N frequency-domain measurement signals within the corresponding sliding window, to obtain the phase-fitting data of the sliding windows.

8. The device according to claim 7, wherein the phase-fitting data comprise a phase-linear-fitting function, and
the phase fitting module is configured for,
according to the phases corresponding to the N frequency-domain measurement signals within each sliding window of the sliding windows, determining an initial phase value;
according to the phase difference between the N frequency-domain measurement signals corresponding to the two neighboring specified frequency points within the each sliding window, determining a fitting slope; and
according to the initial phase value and the fitting slope, determining the phase-linear-fitting function corresponding to the each sliding window.

9. The device according to claim 6, wherein the phase determining module comprises:
a channel-estimation module configured for performing a channel estimation to the frequency-domain measurement sequence, to obtain frequency-domain channel responses corresponding to the N frequency-domain measurement signals, wherein each of the frequency-domain channel responses corresponds to one specified frequency point;
a response-phase module configured for determining the phases corresponding to the frequency-domain channel responses; and
a signal-phase determining module configured for, according to the phases corresponding to the frequency-domain channel responses, determining the phases corresponding to the N frequency-domain measurement signals and the phase difference between the N frequency-domain measurement signals corresponding to the two neighboring specified frequency points.

10. The device according to claim 9, wherein
the response-phase module is configured for
performing a time-domain transformation individually to the frequency-domain channel responses, to obtain corresponding time-domain functions;
performing a windowing-and-noise-suppression processing individually to the corresponding time-domain functions;
performing a frequency-domain transformation individually to the corresponding time-domain functions that have been windowing-and-noise-suppression-processed, to obtain frequency-domain functions; and
calculating to obtain the phases corresponding to the frequency-domain functions.

11. A non-transitory computer readable medium storing a computer program, wherein the computer program comprises a computer-readable code, and when the computer-readable code is executed on a calculating and processing device, the computer-readable code causes the calculating and processing device to perform a method for increasing an accuracy of a phase measurement comprising:
receiving a measurement signal, wherein the measurement signal is generated according to a frequency-domain calibration sequence, the frequency-domain calibration sequence comprises N frequency-domain calibration signals, each of the N frequency-domain calibration signals corresponds to one specified frequency point, specified frequency points are within a specified frequency band, and N is an integer greater than 1;

performing a frequency-domain transformation to the measurement signal to obtain a frequency-domain measurement sequence, wherein the frequency-domain measurement sequence comprises N frequency-domain measurement signals, and each of the N frequency-domain measurement signals corresponds to one specified frequency point;

determining phases corresponding to the N frequency-domain measurement signals, and determining a phase difference between the N frequency-domain measurement signals corresponding to two neighboring specified frequency points;

according to the phases, the phase difference and a window function, performing a sliding-window-type phase fitting to the frequency-domain measurement sequence, to obtain phase-fitting data corresponding to sliding windows; and according to the phase-fitting data of the sliding windows, determining phase-calibration data corresponding to the sliding windows, and, by using the phase-calibration data of the sliding windows, forming the phase-calibration data within the specified frequency band.

* * * * *